United States Patent
So

(10) Patent No.: US 8,709,197 B2
(45) Date of Patent: Apr. 29, 2014

(54) METHOD OF MAKING ELECTRONIC COMPONENT AND HEAT CONDUCTIVE MEMBER AND METHOD OF MOUNTING HEAT CONDUCTIVE MEMBER FOR ELECTRONIC COMPONENT

(75) Inventor: Tsuyoshi So, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 724 days.

(21) Appl. No.: 12/155,680

(22) Filed: Jun. 6, 2008

(65) Prior Publication Data
US 2008/0295957 A1 Dec. 4, 2008

Related U.S. Application Data

(63) Continuation of application No. PCT/JP2005/022551, filed on Dec. 8, 2005.

(51) Int. Cl.
*B29C 65/00* (2006.01)
*B32B 37/00* (2006.01)

(52) U.S. Cl.
USPC ........ 156/307.1; 156/292; 156/293; 156/297; 438/118; 257/707

(58) Field of Classification Search
USPC .................. 257/704, 706, 707, 712, E21.499; 156/84, 297, 299, 307.7, 308.2, 309.6, 156/292, 293, 300, 307.1, 310; 438/118, 438/122
See application file for complete search history.

(56) References Cited

U.S. PATENT DOCUMENTS

| | | | |
|---|---|---|---|
| 5,217,922 A | | 6/1993 | Akasaki et al. |
| 5,219,794 A | | 6/1993 | Satoh et al. |
| 5,641,713 A | * | 6/1997 | Kyle .............................. 156/330 |
| 6,021,046 A | * | 2/2000 | McLellan et al. ............. 361/719 |
| 6,046,077 A | | 4/2000 | Baba |
| 6,451,422 B1 | * | 9/2002 | Nguyen ........................ 428/323 |
| 6,870,258 B1 | | 3/2005 | Too |
| 2004/0036183 A1 | * | 2/2004 | Im et al. ........................ 257/796 |
| 2005/0041406 A1 | * | 2/2005 | Matayabas et al. ........... 361/784 |

FOREIGN PATENT DOCUMENTS

| | | |
|---|---|---|
| JP | 54-108273 | 8/1979 |
| JP | 8-78837 | 3/1996 |
| JP | 9-17827 | 1/1997 |
| JP | 11-204552 | 7/1999 |

(Continued)

OTHER PUBLICATIONS

"Room temperature" from wikipedia.org as captured by archive.org on May 8, 2004.*

(Continued)

*Primary Examiner* — John Goff
(74) *Attorney, Agent, or Firm* — Fujitsu Patent Center

(57) ABSTRACT

A bonding material is placed on an electronic component. a heat conductive member is superposed on the surface of the bonding material so that a thermosetting adhesive is interposed between the heat conductive member and a substrate. The thermosetting adhesive is then cured at a temperature lower than the melting point of the bonding material. The bonding material melts after the thermosetting adhesive has cured. While a distance is maintained between the heat conductive member and the substrate, the thermosetting adhesive is cured. The heat conductive member is thus reliably prevented from a downward movement regardless of the melting of the bonding material. A space is maintained between the heat conductive member and the electronic component. The cured bonding material is reliably prevented from suffering from a reduction in the thickness.

3 Claims, 2 Drawing Sheets

(56) References Cited

FOREIGN PATENT DOCUMENTS

| JP | 2002-190560 | 7/2002 |
|---|---|---|
| JP | 2004-303900 | 10/2004 |
| JP | 2006-49572 | 2/2006 |
| WO | 2004/105129 A1 | 12/2004 |

OTHER PUBLICATIONS dictionary.com definition of "thermoset" from WordNet 2006.*
"Thermosets or Thermoplastics?" from Davies Custom Molding Jul. 18, 2013.*
International Search Report (PCT/ISA/210) of International Application PCT/JP2005/022551 (mailed on Dec. 8, 2005).
English Translation of the International Preliminary Report on Patentability and Written Opinion issued Jun. 19, 2008 in corresponding International Patent Application No. PCT/JP2005/022551.
Amendola A. et al., "Cooling Structure for an Integrated Circuit Module", IBM Technical Disclosure Bulletin, vol. 23, No. 2, Jul. 1980, p. 602.
European Search Report dated Feb. 4, 2010 issued in corresponding European Patent Application 05814186.2.

* cited by examiner

METHOD OF MAKING ELECTRONIC COMPONENT AND HEAT CONDUCTIVE MEMBER AND METHOD OF MOUNTING HEAT CONDUCTIVE MEMBER FOR ELECTRONIC COMPONENT

CROSS REFERENCE TO RELATED PATENT APPLICATIONS

This application is a continuation application, filed under 35 U.S.C. §111(a), of International Application PCT/JP2005/022551, filed Dec. 8, 2005, the entire contents of which are incorporated herein by reference.

BACKGROUND OF THE INVENTION

1. Field of the Invention

The present invention relates to a method of mounting a heat conductive member for an electronic component.

2. Description of the Prior Art

An LSI (Large-Scale Integrated circuit) chip is mounted on a small-sized substrate in an LSI package, for example. A stiffener surrounds the LSI chip on the surface of the substrate. The stiffener contributes to enhancement of the rigidity of the substrate. A heat conductive member or heat spreader is fixed to the surface of the LSI chip. The stiffener is interposed between the heat spreader and the substrate.

A solid solder material is first placed on the LSI chip in a method of making the LSI package. The heat spreader is superposed on the surface of the solid solder material. The stiffener is interposed between the heat spreader and the substrate. A thermosetting adhesive is interposed between the heat spreader and the stiffener as well as between the substrate and the stiffener. Heat is then applied to the solder material and the thermosetting adhesive. The solder material and the thermosetting adhesive melt and are hardened or cured. The heat spreader is in this manner fixed on the surface of the LSI chip. Simultaneously, the stiffener is fixed between the heat spreader and the substrate.

An oven is utilized to heat the LSI chip and the substrate. The temperature inside the oven is set higher than the melting point of the solder material and the curing temperature of the thermosetting adhesive. While the solder material melts on the LSI chip, the thermosetting adhesive melts on and below the stiffener. The heat spreader thus moves downward to get closer to the substrate. The thickness of the solder material in this manner depends on the weight and/or the urging force of the heat spreader. An excessive increase in the thickness of the solder material induces a deteriorated efficiency of heat transfer across the solder material. An excessive reduction in the thickness of solder material induces an unintentional detachment of the heat spreader from the LSI chip.

SUMMARY OF THE INVENTION

It is accordingly an object of the present invention to provide a method of mounting a heat conductive member for an electronic component contributing to a reliable control of the thickness of a bonding material between an electronic component and a heat conductive member.

According to a first aspect of the present invention, there is provided a method of making an electronic component, comprising: placing a bonding material on an electronic component; superposing a heat conductive member on the surface of the bonding material so as to interpose a thermosetting adhesive between the heat conductive member and a substrate; curing the thermosetting adhesive at a temperature lower than the melting point of the bonding material; and melting the bonding material after the thermosetting adhesive has cured.

The heat conductive member is supported on the surface of the bonding material. While a distance is maintained between the heat conductive member and the substrate, the thermosetting adhesive is cured. When the bonding material melts after the thermosetting adhesive has cured, the heat conductive member is supported on the cured thermosetting adhesive. The heat conductive member is thus reliably prevented from a downward movement regardless of the melting of the bonding material. A space is in this manner maintained between the heat conductive member and the electronic component. The cured bonding material is reliably prevented from suffering from a reduction in the thickness. The thickness of the cured bonding material can accurately be controlled based on the original thickness of the bonding material. The method may utilize a bonding material of solid state and a thermosetting adhesive of fluid state.

A support member may be interposed between the heat conductive member and the substrate along with the thermosetting adhesive. In this case, the thermosetting adhesive may endlessly surround the support member between the heat conductive member and the substrate.

According to a second aspect of the present invention, there is provided a method of making an electronic component, comprising: placing a bonding material on an electronic component; superposing a thermosetting adhesive and a heat conductive member on a substrate at a position adjacent to the electronic component so that the heat conductive member is opposed to the surface of the bonding material; applying heat to the thermosetting adhesive for melting the thermosetting adhesive; curing the thermosetting adhesive at a temperature lower than the melting point of the bonding material; and melting the bonding material after the thermosetting adhesive has cured.

The heat conductive member is supported on the surface of the bonding material even after the thermosetting adhesive is melted. While a distance is maintained between the heat conductive member and the substrate, the thermosetting adhesive is cured. When the bonding material melts after the thermosetting adhesive has cured, the heat conductive member is supported on the cured thermosetting adhesive. The heat conductive member is thus reliably prevented from a downward movement regardless of the melting of the bonding material. A space is in this manner maintained between the heat conductive member and the electronic component. The cured bonding material is reliably prevented from suffering from a reduction in the thickness. The thickness of the cured bonding material can accurately be controlled based on the original thickness of the bonding material.

According to a third aspect of the present invention, there is provided a method of making a heat conductive member, comprising: placing a bonding material on a component; superposing a heat conductive member on the surface of the bonding material so as to interpose a thermosetting adhesive between the heat conductive member and a substrate; curing the thermosetting adhesive at a temperature lower than the melting point of the bonding material; and melting the bonding material after the thermosetting adhesive has cured.

The heat conductive member is supported on the surface of the bonding material. While a distance is maintained between the heat conductive member and the substrate, the thermosetting adhesive is cured. When the bonding material melts after the thermosetting adhesive has cured, the heat conductive member is supported on the cured thermosetting adhesive. The heat conductive member is thus reliably prevented from a downward movement regardless of the melting of the bonding material. A space is in this manner maintained between the heat conductive member and the electronic component. The cured bonding material is reliably prevented from suffering from a reduction in the thickness. The thickness of the cured bonding material can accurately be controlled based on the original thickness of the bonding material.

According to a fourth aspect of the present invention, there is provided a method of making a heat conductive member, comprising: placing a bonding material on a component; superposing a thermosetting adhesive and a heat conductive member on a substrate at a position adjacent to the component so that the heat conductive member is opposed to the surface of the bonding material; applying heat to the thermosetting adhesive for melting the thermosetting adhesive; curing the thermosetting adhesive at a temperature lower than the melting point of the bonding material; and melting the bonding material after the thermosetting adhesive has cured.

The heat conductive member is supported on the surface of the bonding material even after the thermosetting adhesive is melted. While a distance is maintained between the heat conductive member and the substrate, the thermosetting adhesive is cured. When the bonding material melts after the thermosetting adhesive has cured, the heat conductive member is supported on the cured thermosetting adhesive. The heat conductive member is thus reliably prevented from a downward movement regardless of the melting of the bonding material. A space is in this manner maintained between the heat conductive member and the electronic component. The cured bonding material is reliably prevented from suffering from a reduction in the thickness. The thickness of the cured bonding material can accurately be controlled based on the original thickness of the bonding material.

According to a fifth aspect of the present invention, there is provided a method of mounting a heat conductive member for an electronic component, comprising: placing a solid bonding material on an electronic component mounted on a substrate; superposing a heat conductive member on the surface of the bonding material so that a support member and a fluid thermosetting adhesive are interposed between the heat conductive member and the substrate; maintaining a temperature equal to or higher than the curing temperature of the thermosetting adhesive and lower than the melting point of the bonding material until the thermosetting adhesive has been cured; and melting the bonding material at a temperature equal to or higher than the melting point of the bonding material after the thermosetting adhesive has cured.

Even when the fluid thermosetting adhesive is interposed between the heat conductive member and the substrate, the heat conductive member is supported on the surface of the solid bonding material. The thickness of the bonding material is maintained. When the bonding material melts after the thermosetting adhesive has cured, the heat conductive member is supported on the cured thermosetting adhesive. The heat conductive member is thus reliably prevented from a downward movement regardless of the melting of the bonding material. A space is maintained between the heat conductive member and the electronic component. The fluid bonding material keeps filling a space between the heat conductive member and the electronic component. The bonding material is thus reliably prevented from a reduction in the thickness when the bonding material is cured. The thickness of the cured bonding material can accurately be controlled based on the original thickness of the bonding material.

According to a sixth aspect of the present invention, there is provided a method of mounting a heat conductive member for an electronic component, comprising: placing a solid bonding material on an electronic component mounted on a substrate; superposing a support member, a solid thermosetting adhesive and a heat conductive member on the substrate at a position adjacent to the electronic component so that the heat conductive member is opposed to the surface of the bonding material; applying heat to the solid thermosetting adhesive so that the thermosetting adhesive melts to provide a fluid thermosetting adhesive; maintaining a temperature equal to or higher than the curing temperature of the fluid thermosetting adhesive and lower than the melting point of the bonding material until the fluid thermosetting adhesive has been cured; and melting the bonding material at a temperature equal to or higher than the melting point of the bonding material after the fluid thermosetting adhesive has cured.

Even when the fluid thermosetting adhesive is interposed between the heat conductive member and the substrate, the heat conductive member is supported on the surface of the solid bonding material. The thickness of the bonding material is maintained. When the bonding material melts after the thermosetting adhesive has cured, the heat conductive member is supported on the cured thermosetting adhesive. The heat conductive member is thus reliably prevented from a downward movement regardless of the melting of the bonding material. A space is in this manner maintained between the heat conductive member and the electronic component. The fluid bonding material keeps filling a space between the heat conductive member and the electronic component. The bonding material is thus reliably prevented from a reduction in the thickness when the bonding material is cured. The thickness of the cured bonding material can accurately be controlled based on the original thickness of the bonding material.

BRIEF DESCRIPTION OF THE DRAWINGS

The above and other objects, features and advantages of the present invention will become apparent from the following description of the preferred embodiment in conjunction with the accompanying drawings, wherein.

DESCRIPTION OF THE PREFERRED EMBODIMENT

Figure 1:
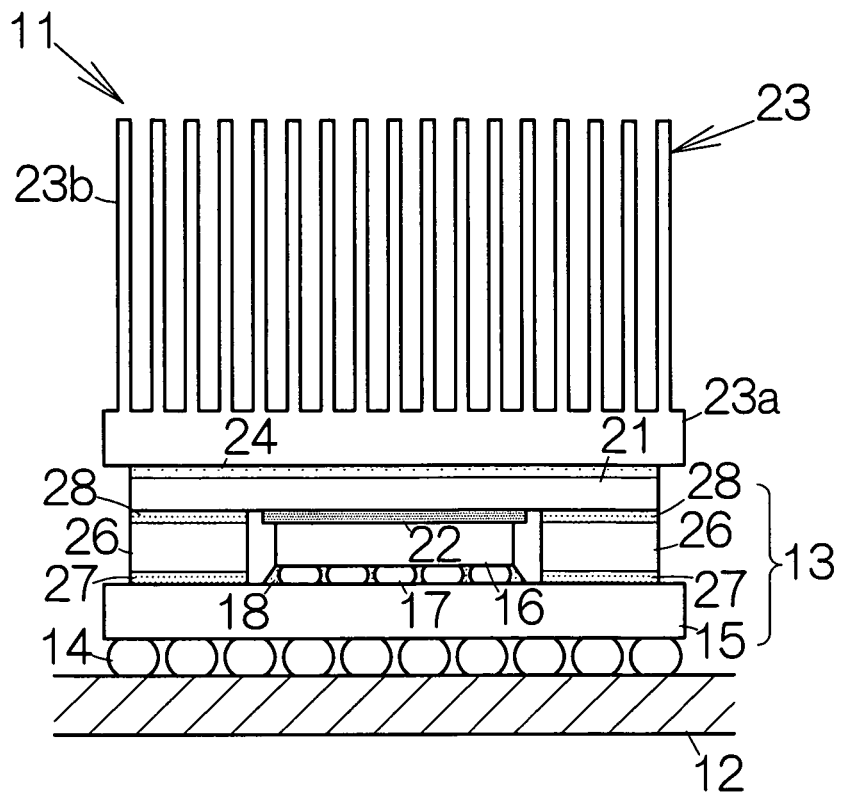
FIG. 1 is a side view schematically illustrating a printed circuit board unit.

FIG. 1 schematically illustrates the structure of a printed circuit board unit 11. The printed circuit board unit 11 includes a printed wiring board 12 made of a resin material. An electronic component package, namely an LSI (Large-Scale Integrated circuit) package 13 is mounted on the surface of the printed wiring board 12. Terminal bumps 14 are utilized to fix the LSI package 13 to the printed wiring board 12. The terminal bumps 14 may be made of an electrically-conductive material such as solder, for example.

The LSI package 13 includes a substrate 15 mounted on the front or upper surface of the printed wiring board 12. The substrate 15 may be made of a resin material, for example. An electronic component or LSI chip 16 is mounted on the front or upper surface of the substrate 15. Terminal bumps 17 are utilized to fix the LSI chip 16 to the substrate 15. The terminal bumps 17 may be made of an electrically-conductive material such as solder, for example. The terminal bumps 17 are sealed on the substrate 15. An underfill material 18 is filled in a space between the LSI chip 16 and the substrate 15. A ceramic substrate may be employed as the substrate 15, for example.

The LSI package 13 includes a heat conductive member or heat spreader 21. The heat spreader 21 is received on the upward flat surface of the LSI chip 16. The heat spreader 21 may be formed in the shape of a flat plate extending outward from the outer periphery of the upward flat surface of the LSI chip 16. The heat spreader 21 thus completely covers over the upward flat surface of the LSI chip 16. The heat spreader 21 may be made of a heat conductive material such as copper, aluminum, aluminum carbide, silicon carbide, aluminum silicon carbide (AlSiC), or the like.

A bonding material 22 having heat conductivity is interposed between the LSI chip 16 and the heat spreader 21. The bonding material 22 extends by a constant thickness on the upward flat surface of the LSI chip 16. The bonding material 22 serves to couple the heat spreader 21 to the upward flat surface of the LSI chip 16. A low temperature solder is employed as the bonding material 22, for example. Solidification of the bonding material 22, once melted, allows the bonding material 22 to closely contact with the upward flat surface of the LSI chip 16 without any gap. Likewise, solidification of the bonding material 22, once melted, allows the bonding material 22 to closely contact with the downward flat surface of the heat spreader 21 without any gap.

A heat radiating member or heat sink 23 is received on the heat spreader 21. The heat sink 23 includes a main body in the shape of a flat plate, namely a heat receiver 23a, and fins 23b standing upright in the perpendicular direction from the heat receiver 23a. The heat receiver 23a has a downward flat surface opposed to the upward flat surface of the heat spreader 21. Parallel air passages are defined between adjacent ones of the fins 23b. The heat sink 23 may be made of a metallic material such as aluminum, copper, or the like. A molding process may be employed to make the heat sink 23.

A fluid having heat conductivity, namely a thermal grease 24, is interposed between the upward flat surface of the heat spreader 21 and the downward flat surface of the heat sink 23. The thermal grease 24 includes a silicone grease and fine particles having heat conductivity, namely heat conductive filler, dispersed in the silicone grease, for example. Ceramic particles or metallic particles may be employed as the heat conductive filler, for example. Alternatively, a heat conductive sheet or a heat conductive gel may be interposed between the upward flat surface of the heat spreader 21 and the downward flat surface of the heat sink 23.

The LSI chip 16 generates heat during its operation. The heat of the LSI chip 16 is transferred to the heat spreader 21 through the bonding material 22. The heat of the LSI chip 16 is allowed to spread over a wide range in the heat spreader 21. The heat is then transferred to the heat sink 23 through the thermal grease 24. The heat is radiated into the air from the surface of the heat sink 23 having a large surface area. Rise in the temperature of the LSI chip 16 is in this manner efficiently suppressed. In addition, the thickness of the bonding material 22 is set at the minimum permissible thickness as described later. The heat is thus efficiently transferred to the heat spreader 21 from the LSI chip 16. As long as the bonding material 22 is allowed to have the minimum permissible thickness, the LSI chip 16 is reliably prevented from an unintentional detachment from the heat spreader 21.

A support member or stiffener 26 is fixed on the substrate 15 at a position adjacent to the LSI chip 16. A thermosetting adhesive 27 is interposed between the stiffener 26 and the substrate 15. The thermosetting adhesive 27 serves to fix the stiffener 26 to the upward surface of the substrate 15. The coefficient of thermal expansion of the stiffener 26 may be set to coincide with that of the substrate 15, for example. In this case, the stiffener 26 may be made of copper or stainless steel, for example. The stiffener 26 contributes to enhancement of the rigidity of the substrate 15.

A thermosetting adhesive 28 is likewise interposed between the stiffener 26 and the heat spreader 21. The thermosetting adhesive 28 serves to fix the heat spreader 21 to the stiffener 26. The weight of the heat sink 23 is thus supported on the stiffener 26. The LSI chip 16 is allowed to only suffer from a reduced load applied through the heat sink 23. The LSI chip 16 is in this manner prevented from suffering from destruction. The curing temperature of the thermosetting adhesives 27, 28 is set lower than the melting point of the bonding material 22 as described later. The melting point of the thermosetting adhesives 27, 28 may be set lower than the curing temperature of the thermosetting adhesives 27, 28. The melting point of the bonding material 22 is preferably set sufficiently higher than the normal temperature (the room temperature, for example). The melting point of the terminal bumps 14, 17 is preferably set higher than the melting point of the bonding material 22.

Figure 2:
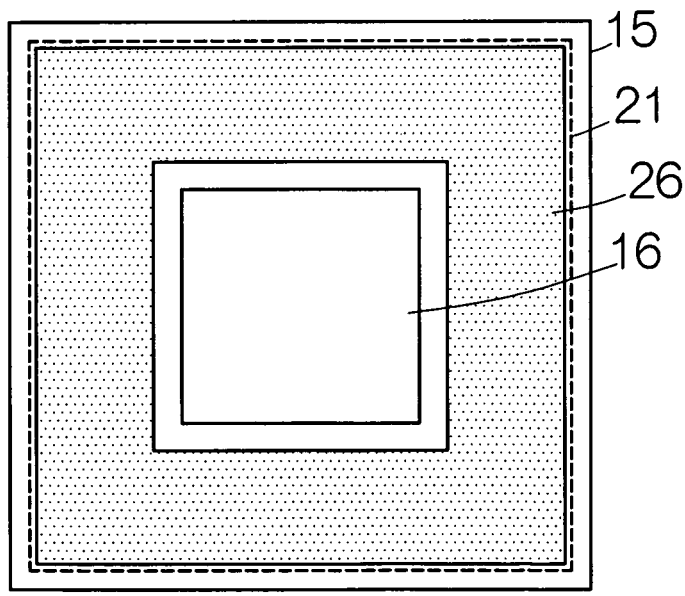
FIG. 2 is a plan view of a substrate.

As is apparent from FIG. 2, the stiffener 26 surrounds the LSI chip 16 without interruption on the substrate 15. The stiffener 26 is interposed between the heat spreader 21 and the substrate 15 endlessly around the LSI chip 16. The thermosetting adhesives 27, 28 may be interposed between the stiffener 26 and the substrate 15 as well as between the stiffener 26 and the heat spreader 21 over the entire length of the stiffener 26.

Figure 3:
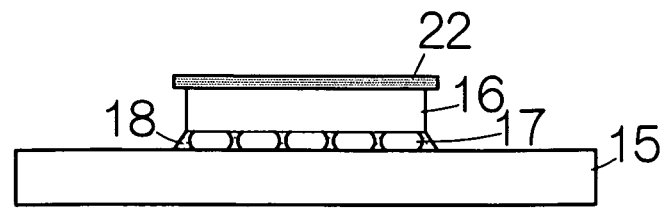
FIG. 3 is a side view of the substrate for illustrating a bonding material of solid state placed on a LSI chip.

Next, a detailed description will be made on a method of making the LSI package 13. As shown in FIG. 3, for example, the substrate 15 is prepared. The LSI chip 16 is mounted on the substrate 15. The bonding material 22 of solid state is placed on the upward flat surface of the LSI chip 16. A low temperature solder plate having a predetermined thickness may be employed as the bonding material 22 of solid state. The contour of the low temperature solder plate may be formed to correspond to the contour of the upward flat surface of the LSI chip 16.

Figure 4:
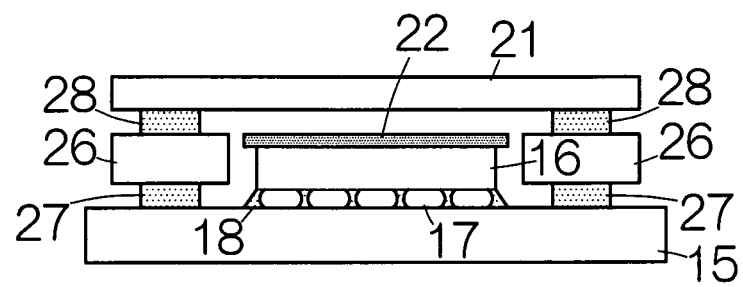
FIG. 4 is a side view of the substrate for illustrating thermosetting adhesives of solid state and a stiffener placed on the substrate.

As shown in FIG. 4, the thermosetting adhesive 27 of solid state, the stiffener 26 and the thermosetting adhesive of solid state 28 are superposed on the substrate 15 in this sequence to surround the LSI chip 16. A thermosetting adhesive sheet may be employed as the thermosetting adhesives 27, 28. Here, the top surface of the upper thermosetting adhesive 28 is positioned higher than the upper surface of the bonding material 22. It should be noted that the top surface of the thermosetting adhesive 28 may be positioned within a plane including the upward surface of the bonding material 22. The heat spreader 21 is thereafter placed on the top surface of the upper thermosetting adhesive 28. The thermosetting adhesive 27 of solid state, the stiffener 26 and the thermosetting adhesive 28 of solid state are interposed between the heat spreader 21 and the substrate 15. The downward surface of the heat spreader 21 is opposed to the upward surface of the bonding material 22 at a predetermined distance.

Figure 5:
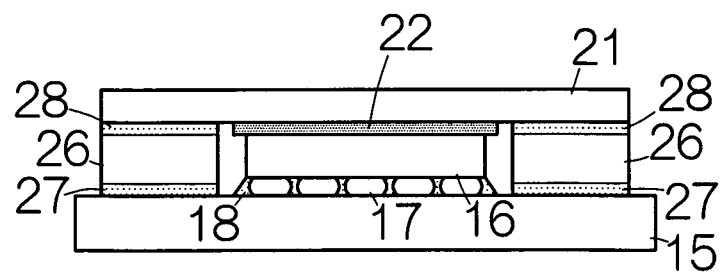
FIG. 5 is a side view of the substrate for illustrating the thermosetting adhesives when the thermosetting adhesives melt.

The substrate 15 is then set in an oven. The temperature in the oven is set at a first temperature equal to or higher than the curing temperature of the thermosetting adhesives 27, 28. It should be noted that the first temperature is set lower than the melting point of the bonding material 22. Since the melting point of the thermosetting adhesives 27, 28 is lower than the curing temperature of the thermosetting adhesives 27, 28, the thermosetting adhesives 27, 28 melt before the temperature of the oven reaches the curing temperature of the thermosetting adhesives 27, 28. The thermosetting adhesives 27, 28 of fluid state are designed to have a predetermined viscosity and/or surface tension, so that the thermosetting adhesives 27, 28 of fluid state are reliably held between the substrate 15 and the stiffener 26 as well as between the stiffener 26 and the heat spreader 21. As shown in FIG. 5, when the thermosetting adhesives 27, 28 have melted, the heat spreader 21 moves downward to get closer to the substrate 15. The downward surface of the heat spreader 21 is received on the upward surface of the bonding material 22. The weight of the heat spreader 21 is supported on the bonding material 22, the LSI chip 16, the terminal bumps 17 and the underfill material 18. The height of the heat spreader 21 is then maintained. The aforementioned thickness of the bonding material 22 is maintained.

The first temperature is maintained in the oven for a predetermined duration. When the predetermined duration has elapsed, the thermosetting adhesives 27, 28 are completely hardened or cured. The bonding material 22 is reliably prevented from melting during the elapse of the predetermined duration. The predetermined duration is set in a range between one or two hours approximately. It should be noted that the predetermined duration depends on the property of the thermosetting adhesives 27, 28.

When the thermosetting adhesives 27, 28 have been cured, a second temperature higher than the first temperature is set in the oven. The second temperature is set higher than the melting point of the bonding material 22. The bonding material 22 thus melts. Since the bonding material 22 of fluid state is allowed to have a predetermined viscosity and/or surface tension, the bonding material 22 of fluid state keeps filling a space between the heat spreader 21 and the LSI chip 16. The weight of the heat spreader 21 is supported on the cured thermosetting adhesives 27, 28 and the stiffener 26. The heat spreader 21 is thus reliably prevented from a downward movement. The height of the heat spreader 21 is maintained regardless of the melting of the boding material 22.

The substrate 15 is then taken out of the oven. The bonding material 22 is subjected to a cooling process. The bonding material 22 is thus hardened or cured. The height of the heat spreader 21 is maintained until the bonding material 22 is cured as described above. The bonding material 22 is thus allowed to keep the original thickness even after the bonding material 22 has cured. The thickness of the cured bonding material 22 reliably reflects the original thickness of the bonding material 22 of solid state. When the bonding material 22 of solid state has a permissible minimum thickness, the cured bonding material 22 is allowed to keep the permissible minimum thickness. In the case where the thickness of the bonding material 22 is smaller than the permissible minimum thickness, the downward surface of the heat spreader 21 tends to suffer from an unintentional detachment from the upward flat surface of the LSI chip 16.

The method of making the LSI package 13 allows utilization of a thermosetting adhesive of fluid state, in place of the thermosetting adhesive of solid state, interposed between the substrate 15 and the stiffener 26 as well as between the stiffener 26 and the heat spreader 21. In this case, the downward surface of the heat spreader 21 may be received on the upward surface of the bonding material 22 beforehand.

What is claimed is:

1. A method of making an electronic component, comprising:
   placing a bonding material on an electronic component;
   superposing a heat conductive member on a substrate so as to interpose a thermosetting adhesive in solid state between the heat conductive member and the substrate so that the heat conductive member is opposed to surface of the solid bonding material;
   applying heat to the thermosetting adhesive to liquefy the thermosetting adhesive so as to bring the heat conductive member in contact with the surface of the solid bonding material;
   curing the thermosetting adhesive at a temperature lower than a melting point of the bonding material;
   supporting the heat conductive member with only the solid bonding material so as to maintain a distance between the heat conductive member and the electronic component based on a thickness of the solid bonding material when the thermosetting adhesive has fluidity; and
   melting the bonding material after the thermosetting adhesive has cured.

2. A method of making a heat conductive member, comprising:
   placing a bonding material on a component;
   superposing a heat conductive member on a substrate so as to interpose a thermosetting adhesive in a solid state between the heat conductive member and the substrate so that the heat conductive member is opposed to a surface of the solid bonding material;
   applying heat to the thermosetting adhesive to liquefy the thermosetting adhesive so as to bring the heat conductive member in contact with surface of the solid bonding material;
   curing the thermosetting adhesive at a temperature lower than a melting point of the bonding material;
   supporting the heat conductive member with only the solid bonding material so as to maintain a distance between the heat conductive member and the component based on a thickness of the solid bonding material when the thermosetting adhesive has fluidity; and
   melting the bonding material after the thermosetting adhesive has cured.

3. A method of mounting a heat conductive member for an electronic component, comprising:
   placing a solid bonding material on an electronic component mounted on a substrate;
   superposing a heat conductive member, so as to interpose a support member a solid thermosetting adhesive between the heat conductive member and the substrate so that the heat conductive member is opposed to a surface of the solid bonding material;
   applying heat to the solid thermosetting adhesive so that the solid thermosetting adhesive liquefies to provide a fluid thermosetting adhesive, thereby bringing the heat conductive member in contact with the surface of the solid bonding material;
   maintaining a temperature equal to or higher than a curing temperature of the fluid thermosetting adhesive and lower than a melting point of the solid bonding material until the fluid thermosetting adhesive has been cured;
   supporting the heat conductive member with only the solid bonding material so as to maintain a distance between the heat conductive member and the electronic component based on thickness of the solid bonding material when the thermosetting adhesive has fluidity; and
   melting the solid bonding material at a temperature equal to or higher than the melting point of the solid bonding material after the fluid thermosetting adhesive has cured.

* * * * *